United States Patent [19]

Suzuki et al.

[11] Patent Number: 4,645,958
[45] Date of Patent: Feb. 24, 1987

[54] VARIABLE DELAY GATE CIRCUIT

[75] Inventors: Hirokazu Suzuki, Yamato; Takehiro Akiyama; Teruo Morita, both of Kawasaki; Hirofumi Takeda, Yokohama; Hikotaro Masunaga, Tokyo, all of Japan

[73] Assignee: Fujitsu Limited, Kawasaki, Japan

[21] Appl. No.: 679,998

[22] Filed: Dec. 10, 1984

[30] Foreign Application Priority Data

Dec. 9, 1983 [JP] Japan .............................. 58-232531
Jul. 20, 1984 [JP] Japan .............................. 59-149587

[51] Int. Cl.⁴ ..................... H03K 5/13; H03K 5/159
[52] U.S. Cl. ................................. 307/597; 307/254; 307/592
[58] Field of Search ......................... 307/591–602, 307/488, 467, 254

[56] References Cited

U.S. PATENT DOCUMENTS 4,180,750  12/1979  Ozawa et al. .................. 307/597
4,516,041  5/1985  Quan ............................. 307/597

Primary Examiner—John S. Heyman
Assistant Examiner—B. P. Davis
Attorney, Agent, or Firm—Staas & Halsey

[57] ABSTRACT

A gate circuit device of an integrated circuit tester, for variably setting the signal propagation delay time of various integrated circuits to be tested at a predetermined value, includes a gate circuit having a pair of emitter coupled transistors and a constant current source transistor connected to the emitter side of the pair of transistors, and a terminal to apply a predetermined level of voltage to the base of the constant current source transistor to control the constant current. In addition to this manner of the voltage control of signal propagation delay time, a current adjustment circuit is utilized to generate current in a constant current source transistor in response to the control current. Thus, the gate circuit device controls the signal propagation delay time by regulating either voltage or current in response to the control current.

18 Claims, 8 Drawing Figures

1

VARIABLE DELAY GATE CIRCUIT

BACKGROUND OF THE INVENTION

The present invention relates to a gate circuit device for adjusting the delay time of an output signal corresponding to an input signal.

A test apparatus for integrated circuits (referred to as an IC tester hereafter) is provided with a number of pins for output signals, from which pins various signals are supplied to integrated circuits in order to check the output condition. In such a case, it is sometimes desired to apply said various signals simultaneously or within in a specified time interval. However, since each circuit generating each of said signals is formed in various manner with different numbers of gates, the time interval in generating each of said signals varies considerably, although the difference is only in order of nanoseconds (ns).

SUMMARY OF THE INVENTION

It is therefore the object of the present invention to offer a gate circuit device to output said various signals, in which each logic gate is capable of producing the output with the same time interval by adding a minute adjustment circuit which varies the delay time of the output signals relative to the input signals, that is, of the, signal propagation delay time Tpd, to alter time interval of the output by operation of said minute adjustment circuit.

According to the present invention, there is provided a gate circuit, device comprising a gate circuit having a pair of emitter coupled transistors a constant current source transistor connected to the emitter side of the first transistors, and a terminal which applies a voltage of a predetermined level to a base of said constant current source transistor to control the value of the constant current which said constant current source transistor causes to flow, whereby the signal propagation delay time of said gate circuit is varied to, and settled at, a predetermined value.

According to another feature of the invention, there is provided a gate circuit comprising a gate circuit having a pair of emitter coupled transistors and a constant current source transistor connected to the emitter side of the first mentioned transistors, a control terminal for receiving an externally supplied control current, and a current adjustment circuit means connected to said control terminal and said constant current source transistor, to generate in said constant current source transistor a predetermined current in response to said control current, whereby the signal progapation delay time of said gate circuit is varied to and settled at a predetermined value.

BRIEF DESCRIPTION OF THE DRAWINGS

The above and other features of the present invention will become clear from the ensuing descriptions of the preferred embodiments made in reference to the attached drawings, wherein.

DESCRIPTION OF THE PREFERRED EMBODIMENTS

Figure 1:
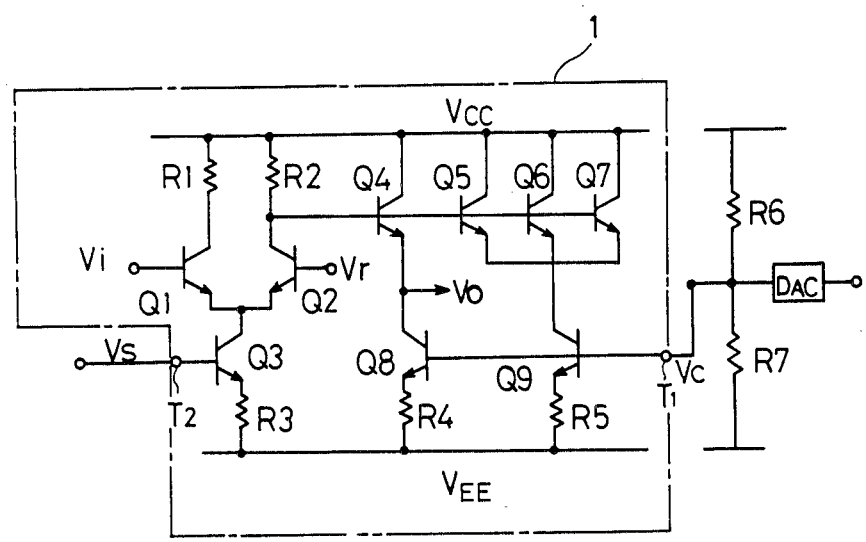
FIGS. 1 and 3 are the circuit diagrams of two embodiments of the invention.

The first embodiment of the invention is shown in FIG. 1 in which emitter coupled transistors Q1 and Q2, a constant current source transistor Q3, and resistors R1 to R3 constitute an emitter coupled logic (ECL) circuit. Transistor Q8 constituting a constant current source and a resistor R4 form a load for an output emitter follower transistor Q4. Vi denotes input the voltage to the logic gate circuit formed by the above-described components, Vr the reference voltage,f Vo the output voltage, and Vs the voltage that determines the value of the constant current. Reference voltage Vr is a threshold voltage for determining the high (H) and low(L) states of the input voltage Vi, and, when Vi is high relative to Vr, the transistor Q1 turns on and the transistor Q2 is turned off, and the output Vo is at the high state, and when Vi is low relative to Vr, the transistor Q1 turns off, the transistor Q2 is turned on, and the output voltage Vo is at the low state.

In the above circuit, the output voltage Vo lags a certain length of time relative to the input voltage Vi, but this delay time is constant depending upon the value of the current. To adjust the current in this circuit, an additional emitter follower circuit comprising the transistors Q5 to Q7, the transistor Q9 and the resistor R5 is connected in parallel to an output emitter follower circuit Q4, Q8, R4 of the output level, with the additional emitter follower circuit functioning as a load capacitor, thus controlling the value of the current flowing in said load circuit Q8, Q9 by virtue of the control voltage Vc that is applied to a terminal T1. The control voltage Vc is externally applied to the device 1 by a digital/analog converter DAC from which a constant voltage is applied by the dividing resistors R8, R9.

The transistors Q5 to Q7 are connected parallel, their bases being connected to an output terminal of the ECL circuit together with the base of transistor Q4. By this arrangement, the base capacitance of the transistors Q5 to Q7 is connected to the output terminal of the ECL circuit, and the delay time Tpd increases. The base capacitance of the transistors Q5 to Q7 varies depending on the value of the current flowing through each of these transistors, but since the transistor Q9 regulates by means of control voltage Vc the value of the total currents flowing in the transistors Q5 to Q7, the base capacitor of each of the transistors Q5 to Q7 is regulated by the control voltage Vc, and consequently the delay time Tpd is made adjustable by an external control voltage Vc. Further, since the control voltage Vc is also applied to the base of the transistor Q8, the value of the current at the output terminal is also regulated by the control voltage Vc, so that the delay time Tpd is made adjustable.

When the control voltage Vc is set in a high state to increase the current through the transistors Q8, Q9, the working of the emitter follower circuit becomes rapid and the delay time Tpd is decreased. Contrary to this, when the control voltage Vc is lowered to decrease the current through the transistors Q8, Q9, the working of the emitter follower circuit slows down and the delay time Tpd is increased.

Figure 2:
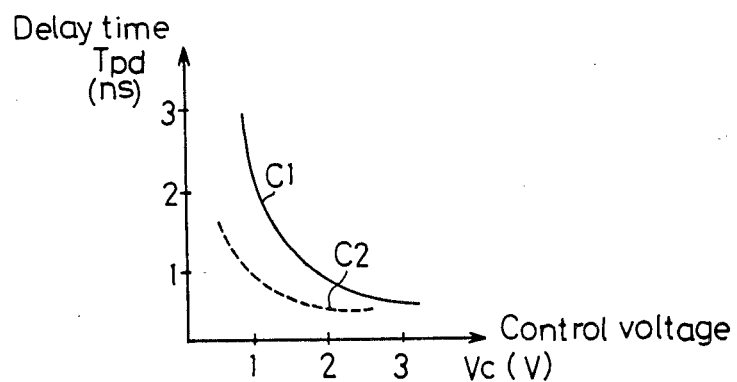
FIGS. 2 and 4 are graphs showing the operational characteristics of said embodiments.

FIG. 2 shows the relationship of the control voltage Vc relative to the signal propagation delay time Tpd, in which the axis of the abscissa represents the control voltage Vc in volts, the axis of the ordinate is the signal propagation delay time Tpd in nanoseconds. The dotted curve C2 shows the delay characteristic when there is only one transistor Q8 with transistors Q5 to Q7 and Q9 omitted, and curve C1 shows the delay characteristic with the load circuit including Q5 to Q7, Q9, R5. When the number of the transistors Q5, Q6 . . . is increased, the load capacitor increases accordingly and thus the delay time Tpd increases. In the above circuit, the control voltage Vc is commonly applied to the transistor Q8 of the output level of the emitter follower circuit and the transistor Q9 of the load circuit. However, if the control voltage Vc is applied independently to the transistors Q8, Q9, a finer adjustment of the delay time will be realized.

Further, by adding the load circuit Q5 to Q7, as shown in FIG. 2, the range of delay time Tpd, which varies in accordance with the control voltage Vc, becomes large to make possible delay time adjustments with a higher degree of precision.

In another embodiment, the delay time Tpd may be adjusted by regulating the voltage Vs applied externally of the device 1 to a terminal T2 connected to the base of the constant current transistor Q3 of the ECL circuit comprising transistors Q1, Q2. That is, when Vs is increased, the ECL circuit works at a high speed to decrease delay time Tpd, and on the other hand, if Vs is decreased, the ECL circuit works at a low speed to increase the delay time Tpd.

Thus, the delay time Tpd may be changed by either regulating the voltage Vc to the terminal T1 or by regulating the voltage Vs to the terminal T2, and it is possible to regulate both voltages simultaneously or to regulate either one or both independently.

Figure 3:
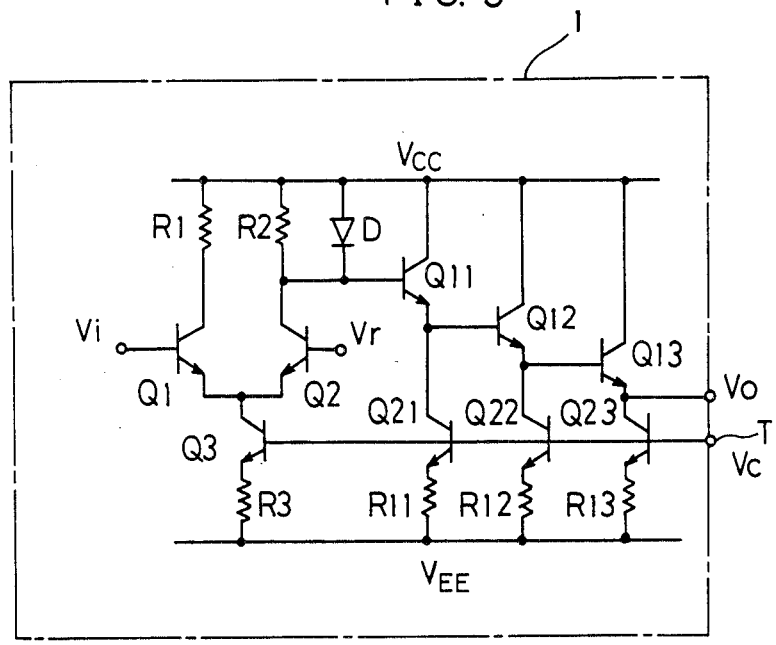

FIG. 3 shows an other embodiment of the invention, in which the same components as those shown in FIG. 1 are designated by the same reference numbers. The transistors Q11, Q21 and the resistor R11, the transistors Q12, Q22 and the resistor R12, and the transistors Q13, Q23 and the resistor R13 provide respective emitter follower circuits respectively, transistors Q21 to Q23 forming respective constant current sources thereof. In other words, the emitter follower of FIG. 1 is replaced by three levels of emitter followers connected consecutively, with the control voltage Vc being commonly applied to the constant current transistors Q21 to Q23 and to the base of the constant current source transistor Q3.

In this circuit, when the current of transistors Q3 and Q21 to Q23 is increased by increasing the control voltage Vc, the working speed of both the ECL circuit and of the emitter follower circuit becomes high to decrease the delay time Tpd. When the control voltage Vc is lowered, the reverse takes place.

Figure 4:
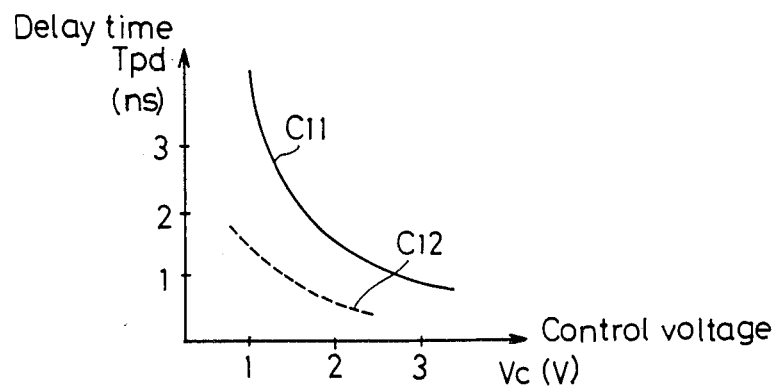

FIG. 4 shows the delay characteristics of said circuit. Curve C11 represents the delay characteristic when the entire circuit is regulated by the control voltage Vc, and the dotted curve C12 shows the characteristic when the ECL circuit alone is so regulated. This shows that, by regulating the constant current transistors Q21 to Q23 of the emitter follower simultaneously, rather than by regulating only the base potential of the constant current transistor Q3 of the ECL circuit, the delay time Tpd may be increased more than when the control voltage Vc is lowered in the same manner. Further, it shows that, by providing several levels of emitter follower, the entire delay time Tpd is, increased, that is a high precision adjustment of the delay time Tpd becomes possible by regulating the control voltage Vc. It may also be arranged in said circuit so that either one or both of transistors Q3 and transistors Q21 to Q23 may be regulated independently.

Figure 5:
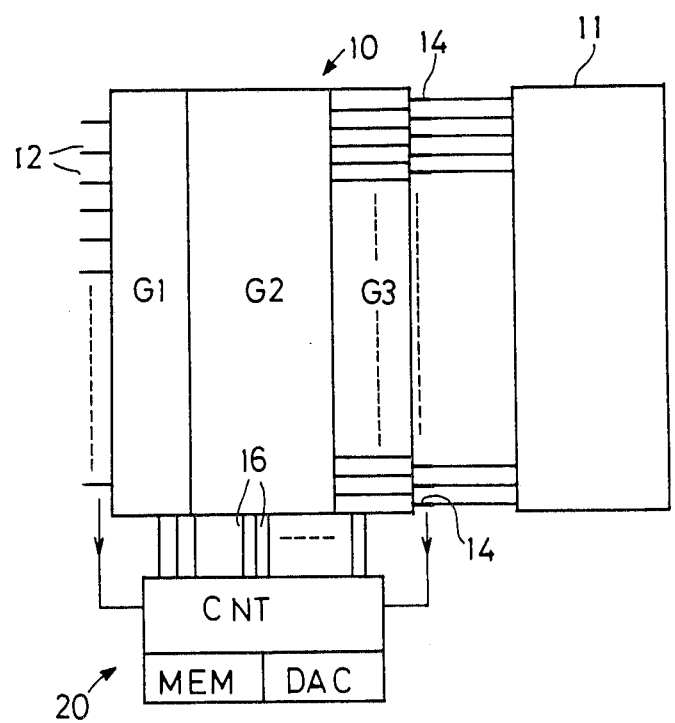
FIG. 5 is a block diagram of one application of the invention.

FIG. 5 illustrates an application of the circuit of the invention to an IC tester in which various signals are generated at generator 10 having groups of input terminal pins 12, output terminal pins 14 and control terminal pins 16, respectively. Each pin 14 is connected to an integrated circuit (IC) 11 to be tested. The circuit of the invention is employed in an output gate group G3, in an input gate group G1 or in an internal gate group G2. The number of the circuits of the invention as shown in FIG. 1 or FIG. 3 is the same as the number of output terminal pins 14. According to the present invention, the circuit in FIG. 1 or 3 is the output gate of the group G3. There is provided a controller 20 comprising the control circuit CNT having counter means which measures the difference in time of the input and output signals for each input and output terminal pin, that is, the delay time Tpd, which serves as an operation circuit to calculate the delay time to be added that is necessary to equalize the delay time Tpd for all the output terminal pins, a table in memory MEM in which is stored the digital control voltage Vc for each output terminal pin, and a digital/analog converter DAC which converts the digital control voltage to an analog voltage. The number of the digital/analog converters DAC equals the number of the output termial pins, and the register means MEM is provided at the input of the converters DAC to provide the memory read out data, so that, in testing integrated circuits, a control voltage Vc for each terminal pin is output from each digital/analog converter DAC. A circuit to generate a designated control voltage Vc may be provided to each side of the terminal pins, that is, to the circuit of FIG. 1 or FIG. 3, to provide only one digital/analog converter DAC in FIG. 5 to which the control voltage Vc of each terminal pin is output, with said control voltage Vc being output to each of said voltage generating circuits. If the delay of the output level gate circuit of FIG. 1 and FIG. 3 is made constant, the measurement of the above delay time Tpd and the determination of the control voltage Vc are done only once, thus making it possible to output from said IC tester various test voltages correctly and at the same time.

The test signal generator 10 and the controller 20 may be fabricated in one LSI or in individual ICS. Where they are fabricated in each IC device individually, the terminal T which receives the control voltage Vc becomes an external terminal pin of an IC in the test signal generator.

In the embodiments of the invention so far described, the adjustment of the delay time is effected by applying a control voltage to either the constant current transistor of the current switch circuit or to the base of the constant current source transistor of the emitter follower circuit. Because of this, the current in either the current switch circuit or the emitter follower circuit in response to the change of the control voltage does not change linearly. Thus, in a certain range of control voltage, the ratio of change of current is too large, and in another range of the control voltage, said ratio is too small. Where the base potential is regulated, it is difficult to set a range of the current change to be sufficiently wide. Further, it is desired to minimize the error in setting the value of the current due to variation of the control voltage and the resistance of the wirings.

In the delay circuit, it is therefore desired to regulate the base current of the transistor placed in the emitter follower circuit, so that current in the emitter follower circuit changes linearly in response to the control voltage.

Figure 6:
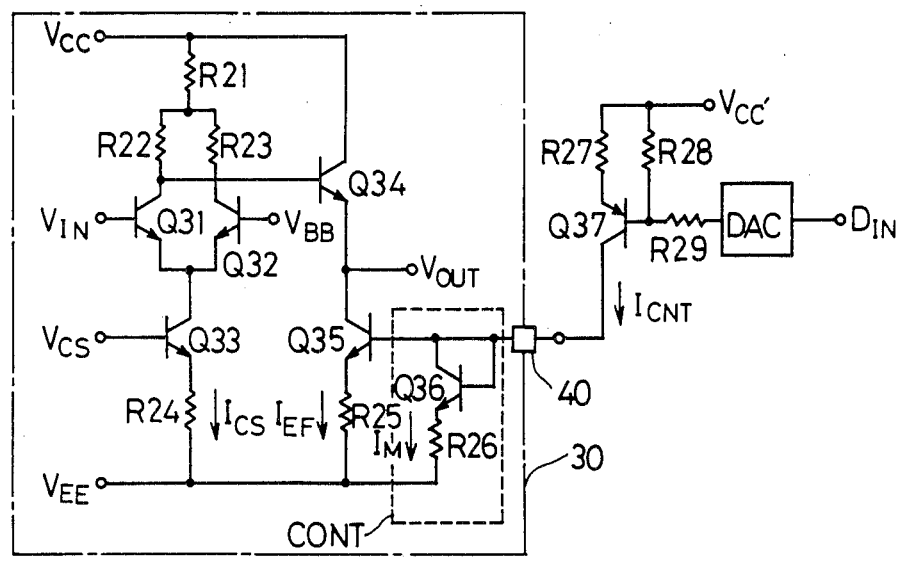
FIG. 6 is a circuit diagram of another embodiment of the invention.

The second embodiment of the invention is shown in FIG. 6 in which the circuit comprises a current switch circuit having emittr coupled transistors Q31, Q32, transistor Q33 for a constant current circuit and resistors R21, R22, R23, R24, an emitter follower circuit having transistors Q34, Q35 and resistor R25, a control current supply circuit having a PNP type transistor Q37, resistors R27, R28, R29, a control current supply circuit having a digital/analog converter DAC and a series circuit of the transistor Q36 connected between the base of the current control transistor Q35 of the emitter follower circuit and the resistor R26. The part with reference numeral 30 is an integrated circuit device, for example, which is arranged to receive the externally-supplied current $I_{CNT}$ through its terminal 40. An input signal $V_{IN}$ is supplied to the base of the transistor Q31 of the current switch circuit, i.e. ECL circuit, and the reference voltage $V_{BB}$ is applied to the base of the transistor Q32. The bias voltage $V_{CS}$ generated internally or externally is applied to the base of the transistor Q33 of the constant current circuit.

In the circuit of FIG. 6, when the input signal $V_{IN}$ is higher than the reference voltage $V_{BB}$, the transistor Q31 turns on with the transistor Q32 turned off, and the low level output signal $V_{OUT}$ is obtained from the emitter of the transistor Q34. Contrary to this, when the voltage of the input signal $V_{IN}$ is lower than the reference voltage $V_{BB}$, the transistor Q31 is turned off with the transistor Q32 turned on, and the output signal $V_{OUT}$ is at the high level voltage.

On the other hand, the digital control signal $D_{IN}$ input to the digital/analog converter DAC is converted to an analog voltage in said converter DAC and is applied to the base of the transistor Q37 via the resistor R29. The control current $I_{CNT}$ corresponding to said analog signal flows to the collector of the transistor Q37, which current flows via the external terminal 40 to the bases of the transistor Q35 and transistor Q36, thus constituting a base current adjustment circuit CONT.

Now, where transistors Q35 and Q36 have the same characteristics, there is a relationship as follows:

$$I_{CNT}/2 = I_{EF} = I_M$$

where $I_{EF}$ is the emitter current of the transistor Q35 and is equal to the current of the emitter follower circuit. Further, $I_M$ is the current of the current adjustment circuit CONT. That is, it becomes possible to adjust linearly the current of the emitter follower circuit, comprised of the transistors Q34, Q35 and the resistor R25, by the control current $I_{CNT}$. Also, the current adjustment circuit CONT, comprising the transistor Q36 and the resistor R26, is in a current mirror relationship to the emitter follower circuit relative to the control signal.

As explained above, by adjusting the external control current $I_{CNT}$ in response to the control signal $D_{IN}$, and by causing the current $I_{EF}$ of the internal emitter follower circuit to vary, it becomes possible to adjust the signal propagation delay time of said emitter follower circuit and to adjust different delay times between the input signal $V_{IN}$ and the output signal $V_{OUT}$.

Figure 7:
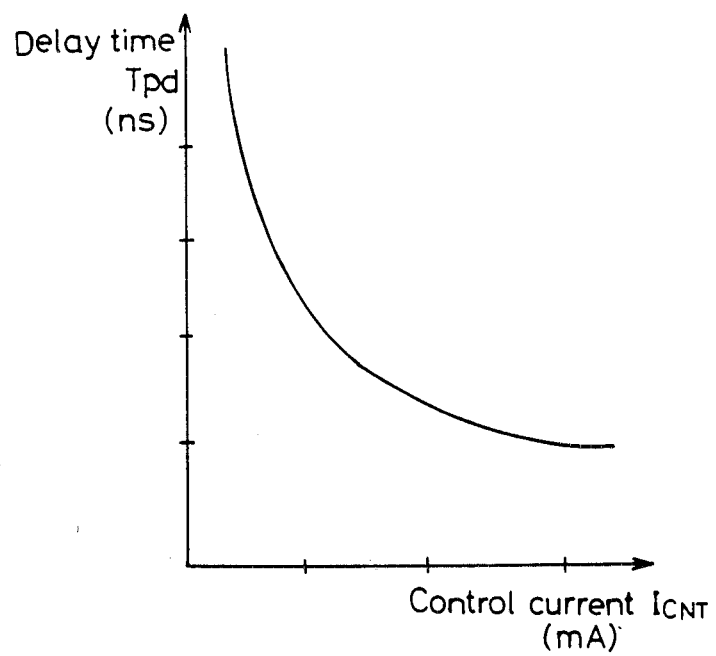
FIG. 7 is a graph showing the characteristics of the circuit of FIG. 6.

FIG. 7 shows one example of the delay time Tpd between the input signal $V_{IN}$ and the output signal $V_{OUT}$ relative to the control current $I_{CNT}$.

In the circuit of FIG. 6, the delay time is adjusted by varying the current of the emitter follower circuit by means of the control current, and it will be clear that adjustment of the delay time is possible also by adjustment of the current in the current switch circuit. In this case, it is enough if the control current $I_{CNT}$ is sent to the base of the current source transistor Q33 in the circuit of FIG. 6. Further, the current of the emitter follower circuit and the current of the current switch circuit may be adjusted together.

Figure 8:
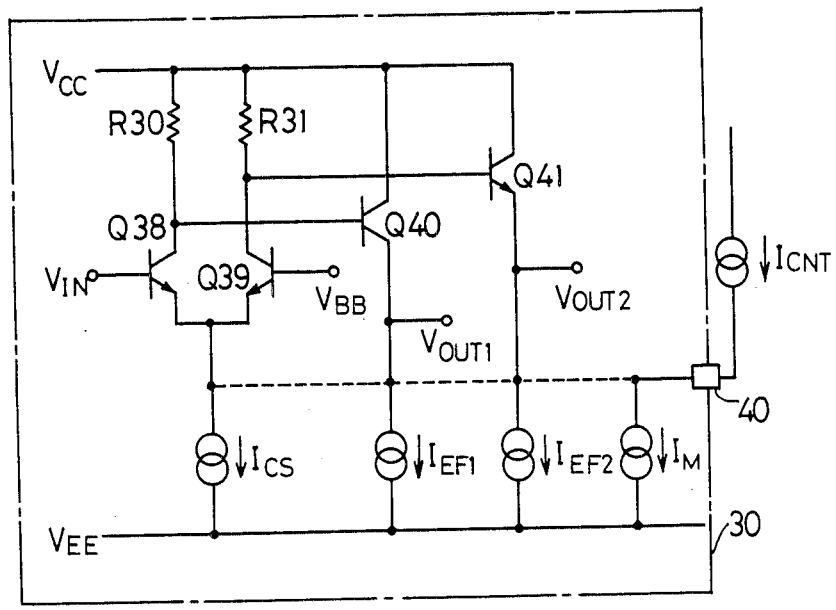
FIG. 8 is a circuit diagram of a modified form of the circuit of the invention.

In other words, in the ECL circuit as shown in FIG. 8, any one of currents $I_{EF1}$ and $I_{EF2}$ of the emitter follower circuits and current $I_{CS}$ of the current switch circuit may be adjusted, or each of said currents, at respective points may be adjusted simultaneously. In such a case, the transistor of each current source forms a current mirror circuit together with the base current adjustment circuit $C_{CNT}$ such as the one shown in FIG. 6. Further, in FIG. 8, the current switch circuit comprises the transistors Q38, Q39 and resistors R30, R31 and the constant current circuit $I_{CS}$, the transistor Q40 and the constant current circuit $I_{EF1}$ form the first emitter follower circuit, and the transistor Q41 and the current source circuit $I_{EF2}$ form the second emitter follower circuit. Further, each of the current source circuits $I_{CS}$, $I_{EF1}$, $I_{EF2}$ may comprise a transistor and a resistor respectively in the same manner as the circuit of FIG. 6, in which case the control current $I_{CNT}$ is supplied to the base of each transistor. In this case again, the current source circuit $I_M$ corresponds to the base current adjustment circuit in the circuit of FIG. 6.

As explained, the first embodiment has the technical effect that, by adding a circuit for adjusting the signal propagation delay time Tpd to the logic gate circuit, a simultaneous output of each signal is realized using said gate circuit at the output level. In the second embodiment, current in the current switch circuit, or in the emitter follower circuit, is adjusted by the current supplied from the control current generating circuit with said control current generating circuit, being formed as a current source circuit, and the current of the current switch circuit, or the current of the emitter follower circuit, is linearly varied relative to the control signal. Because of this, the delay time of the circuit is correctly and easily adjusted. Further, since the delay time is adjusted by the control current, there is no effect from the resistance of the wirings and the unevenness of the base voltage in setting up the delay time.

What is claimed is:

1. A gate circuit device having a variable signal propagation delay time for respective digital input and output signals, said device comprising:
   a digital gate circuit having a pair of emitter coupled transistors and a constant current source transistor connected to the emitter side of said emitter coupled transistors, wherein said digital input signal is provided to a base of a first one of said pair of emitter coupled transistors, and said pair of emitter coupled transistors are turned oppositely ON and OFF by high and low logic states of said digital input signal; and terminal means for applying a selected level of voltage to the base of said constant current source transistor, for thusly controlling the value of a constant current which said constant current source transistor causes to flow;

an output terminal for outputting said digital output signal with respective high and low logic states according to the logic state of said digital input signal and said signal propagation delay time, said output terminal being operatively connected to a collector of one of said pair of emitter coupled transistors;

wherein said signal propagation delay time is variably set at a value according to said selected level of voltage.

2. The device of claim 1, comprising an emitter follower circuit connected to the collector of one of said emitter coupled transistors and a load connected to said emitter follower, wherein said digital output signal is provided as a result of said output terminal being connected to the connection of said load and said emitter follower transistor.

3. The device of claim 2, said load comprising a series connection of a further constant current transistor and a resistor.

4. A gate circuit device having a variable signal propagation delay time for respective digital input and output signals, said device comprising:
a digital gate circuit including
a pair of emitter coupled transistors, wherein said digital input signal is provided to a base of a first one of said pair of emitter coupled transistors, and said pair of emitter coupled transistors are turned oppositely ON and OFF by high and low logic states of said digital input signal;
a first constant current source transistor connected to the emitter side of said emitter coupled transistors;
an emitter follower output level circuit connected to the collector of one of said pair of emitter coupled transistors, said emitter follower output level circuit including a second constant current source transistor;
an output terminal for outputting said digital output signal with respective high and low logic states, said output terminal being connected to the collector of said second constant current source transistor; and
voltage control terminal means for applying a selected level of voltage to the base of said second constant current source transistor, for thusly controlling the value of the constant current which said second constant current source transistor causes to flow;
wherein said digital output signal is provided according to said high and low logic states of said digital input signal and said signal propagation delay time, and said signal propagation delay time is variably set at a selected value according to said selected level of voltage.

5. A gate circuit device having a variable signal propagation delay time for respective digital input and output signals, said device comprising:
a digital gate circuit including a pair of emitter coupled transistors and a constant current source transistor connected to the emitter side of said emitter coupled transistors, wherein said digital input signal is provided to a base of a first one of said pair of emitter coupled transistors, and said pair of emitter coupled transistors are turned oppositely ON and OFF by high and low logic states of said digital input signal;
control terminal means for receiving an externally supplied control current;
an output terminal for outputting said digital output signal with respective high and low logic states, said output terminal being operatively connected to a collector of one of said pair of emitter coupled transistors; and
current adjustment circuit means connected via said control terminal to said constant current source transistor for causing, in response to said control current, a selected current to be generated in said constant current source transistor;
wherein said digital output signal is provided on said output terminal according to said digital input signal, and said signal propagation delay time is variably set at a value according to said selected current.

6. A gate circuit device of claim 5, said current adjustment circuit means including a further transistor, wherein said constant current source transistor and said further transistor of said current adjustment circuit means have a current mirror relationship.

7. A gate circuit device having a variable signal propagation delay time for respective digital input and output signals, said device comprising:
a digital gate circuit including
a pair of emitter coupled transistors, wherein said digital input signal is provided to a base of a first one of said pair of emitter coupled transistors, and said pair of emitter coupled transistors are turned oppositely ON and OFF by high and low logic states of said digital input signal,
a first constant current source transistor connected to the emitter side of said emitter coupled transistors,
an emitter follower circuit connected to the collector of one of said emitter coupled transistors, and
a second constant current source transistor provided in said emitter follower circuit;
control terminal means for receiving an externally supplied control current;
current adjustment means connected to said control terminal and to said second constant current source transistor for causing, in response to said control current, a current of a selected value to be generated in said second constant current source transistor; and
an output terminal for outputting said digital output signal with respective high and low logic states corresponding to said digital input signal and said signal propagation delay time, said output terminal being connected to the input of said second constant current source of said emitter;
wherein said signal propagation delay time is variably set at a value corresponding to said selected current.

8. A gate circuit device of claim 7, said current adjustment circuit means including a transistor, wherein said second constant current source transistor and said transistor of said current adjustment circuit means form a current mirror circuit.

9. A gate circuit device having a variable signal propagation delay time for respective digital input and output signals, said device comprising:

a gate circuit having a pair of emitter coupled transistors and a first constant current source connected to the emitter side of said emitter coupled transistors, wherein said digital input signal is provided to a base of a first one of said emitter coupled transistors;

a first emitter follower circuit connected to the collector of one of said emitter coupled transistors, said first emitter follower circuit including a first emitter follower connected at its base to a collector of one of said emitter coupled transistors and a second constant current source connected to the output of said first emitter follower;

terminal means for applying at least one respective external control signal to at least one of said first and second constant current sources; and an output terminal operatively connected to the connection point of said output of said first emitter follower and said second constant current source for outputting said digital output signal.

10. The device of claim 9, wherein a respective one of said external control signals is applied to each of said first and second constant current sources via said terminal means.

11. The device of claim 9, comprising a series connection of a plurality of parallel-connected emitter followers and of a third constant current source, wherein said terminal means includes means for providing a respective external control signal to said third constant current source.

12. The device of claim 11, wherein said second and third constant current source are controlled by the same control signal.

13. The device of claim 9, comprising a plurality of further emitter follower circuits interconnected consecutively with each other and with said first emitter follower circuit, and each being connected in series with a respective further constant current source, wherein said terminal means includes means for supplying a respective control signal to each of said further constant current sources.

14. The devices of claim 13, wherein the same control signal is applied to all of said constant current sources.

15. A gate circuit device having a variable signal propagation delay for respective digital input and output signals, said device comprising:

a pair of emitter coupled transistors, said digital input signal being input to a gate of a first one of said emitter coupled transistors;

a first constant current source connected to the emitter side of said emitter coupled transistors;

a first emitter follower connected to a collector of one of said emitter coupled transistors;

a second emitter follower connected to a collector of the other one of said emitter coupled transistors;

second and third constant current sources respectively connected in series with said first and second emitter followers;

a fourth constant current source connected in common with at least one of the others of said constant current sources;

control terminal means for providing respective control signals to at least one of said constant current sources; and a respective output terminal connected to the respective connection point between said first emitter follower and said second constant current source and the connection point of said second emitter follower and said third constant current source, each said output terminal providing a respective one of said digital output signals with respective high and low logic states corresponding to said digital input signal;

wherein said signal propagation delay time for each said digital output signal is variably set at a value corresponding to each said control signal.

16. The device of claim 15, wherein said constant current sources form a mirror current circuit with respect to the respective control signal, and wherein the relation between the current of said control signal and the respective constant currents is linear.

17. The device of claim 16, wherein one control signal is provided in common to each said constant current source.

18. The device of claim 17, each said constant current source being a further transistor, wherein each said control signal is supplied to the base of each said further transistor.

* * * * *

UNITED STATES PATENT AND TRADEMARK OFFICE
CERTIFICATE OF CORRECTION

PATENT NO. : 4,645,958

DATED : February 24, 1987

INVENTOR(S) : Hirokazu Suzuki, Takehiro Akiyama, Teruo Morita, Hirofumi Takeda and Hikotaro Masunaga It is certified that error appears in the above-identified patent and that said Letters Patent is hereby corrected as shown below:

Column 2, line 16, delete "the" and after "denotes" insert --the--;
line 18, delete "f".

Column 3, line 40, change "an other" to --another--;
line 46, delete "respectively," and insert --with--.

Column 4, line 4, "lower," should be --lowers,-- and "that is" should be --that is,--;
line 54, "ICS" should be --ICs--.

Column 5, line 13, "emittr" should be --emitter--.

Signed and Sealed this

Eleventh Day of August, 1987

*Attest:*

DONALD J. QUIGG

*Attesting Officer*　　　　*Commissioner of Patents and Trademarks*